(12) United States Patent
Bieri et al.

(10) Patent No.: US 7,259,558 B2
(45) Date of Patent: Aug. 21, 2007

(54) METHOD FOR DETECTION AND IMAGING OF SYNCHRONOUS SPIN AND CHARGED PARTICLE MOTION

(75) Inventors: Oliver Bieri, Basel (CH); Klaus Scheffler, Basel (CH)

(73) Assignee: University of Basel, Basel (CH)

( * ) Notice: Subject to any disclaimer, the term of this patent is extended or adjusted under 35 U.S.C. 154(b) by 0 days.

(21) Appl. No.: 11/305,330

(22) Filed: Dec. 19, 2005

(65) Prior Publication Data

US 2006/0152219 A1    Jul. 13, 2006

(30) Foreign Application Priority Data

Dec. 17, 2004   (GB)   ................... 0427686.1

(51) Int. Cl.
*G01V 3/00*    (2006.01)
(52) U.S. Cl. ...................... 324/309; 324/306
(58) Field of Classification Search ............... 324/309, 324/307, 306
See application file for complete search history.

(56) References Cited

U.S. PATENT DOCUMENTS

| | | | |
|---|---|---|---|
| 3,932,805 | A | 1/1976 | Abe et al. |
| RE32,701 | E | 6/1988 | Moran |
| 5,592,085 | A | 1/1997 | Ehman |
| 5,757,185 | A | 5/1998 | Hennig |
| 5,825,186 | A | 10/1998 | Ehman et al. |
| 5,899,858 | A | 5/1999 | Muthupillai et al. |
| 5,952,828 | A | 9/1999 | Rossman et al. |
| 5,977,770 | A * | 11/1999 | Ehman ................. 324/318 |
| 6,037,774 | A | 3/2000 | Felmlee et al. |
| 6,246,895 | B1 | 6/2001 | Plewes |
| 6,486,669 | B1 | 11/2002 | Sinkus et al. |

(Continued)

FOREIGN PATENT DOCUMENTS

WO    WO 02/084308    10/2002

(Continued)

OTHER PUBLICATIONS

H.Y. Carr, "Steady-State Free Precession in Nuclear Magnetic Resonance," Phys. Rev. 1958, vol. 112, No. 5, Dec. 1, 1958, p. 1693-1701.

(Continued)

*Primary Examiner*—Louis M. Arana
(74) *Attorney, Agent, or Firm*—Joyce von Natzmer; Pequignot + Myers LLC

(57) ABSTRACT

A method of nuclear magnetic resonance (NMR) imaging is proposed for the rapid detection of oscillatory motion of spins or charged particles to generate shear waves or oscillating electrical currents to induce alternating magnetic fields to the object being imaged, subjected to a fast train of radio-frequency (RF) pulses to induce within the sample a steady-state NMR signal. A scan using an NMR imaging system is carried out with a RF repetition time (TR) matched to the externally imposed oscillatory motion. Small oscillatory displacements of spins in combination with imaging gradients or oscillating magnetic fields related to charge motion generating alternating spin phase dispersions during the rf pulse train disturb the steady-state magnetization. Depending on the amount of spin-phase dispersion, the amplitude and phase of the NMR signals are modulated, generating a brightness-modulation of the reconstructed phase and amplitude images revealing mechanical or electrical properties of the object, such as stiffness or electrical impedance.

38 Claims, 11 Drawing Sheets

U.S. PATENT DOCUMENTS 6,583,624 B1 6/2003 Muthupillai et al.
6,879,155 B2 * 4/2005 Ehman et al. ............... 324/309
2003/0193336 A1 10/2003 Ehman et al.

FOREIGN PATENT DOCUMENTS

WO WO 2004/052169 6/2004

OTHER PUBLICATIONS

A. Oppelt, et al., "FISP: eine neue schnelle Pulssequenz für die Kernspintomographie," Electromedia, 54 (1), 1986, p. 15-18.

Y. Zur, et al., "An Analysis of Fast Imagining Sequences with Steady-State Transverse Magnetization Refocusing," Magn. Reson. Med., 6, 1988, p. 175-193.

S.S. Vasanawala, et al., "Fluctuating Equilibrium MRI," Magn. Reson. Med., 42, 1999, p. 876-883.

S.S. Vasanawala, et al., "Linear Combination Steady-State Free Precession MRI," Magn. Reson. Med., 43, 2000, p. 82-90.

S. Patz, "Some Factors that Influence the Steady State in Steady-State Free Precession," Magn. Reson. Imaging, vol. 6, 1988, p. 405-413.

R. Muthupillai, et al.,"Magnetic Resonance Elastography by Direct Visualization of Propagating Acoustic Stain Wave," Science, vol. 269, Sep. 29, 1995, p. 1854-1857.

R. Muthupillai, et al., "Magnetic Resonance Imaging of Transverse Acoustic Strain Waves," Magn. Reson. Med., 1996; 36 (2), p. 266-274.

R. Sinkus, et al., "High-Resolution Tensor MR Elastography for Breast Tumour Detection," Phys. Med. Biol., vol. 45, 2000, p. 1694-1664.

W.R. Overall, et al., "Oscillating Dual-Equilibrium Steady-State Angiography," Magn. Reson. Med., vol. 47, 2002, p. 513-522.

M.A. Dresner, et al., "MR Elastography of the Prostate," in: Proceedings of the 10$^{th}$ Annual Meeting of ISMRM, Philadelphia, 1999, p. 526.

R. Sinkus, et al., "In-Vivo Prostate MR-Elastography," in: Proceedings of the 11$^{th}$ Annual Meeting of ISMRM, Toronto, Canada, 2003, p. 586.

J.P. Felmlee, et al., "Magnetic Resonance Elastography of the Brain: Preliminary In Vivo Results," in: Proceedings of the 5$^{th}$ Annual Meeting of ISMRM, Vancouver, Canada, 1997, p. 683.

S.A. Kruse, et al., "Palpation of the Brain Using Magnetic Resonance Elastography," in: Proceedings of the 7$^{th}$ Annual Meeting of the ISMRM, Philadelphia, 1999, p. 258.

J. Rydberg, et al., "Fast Spin-Echo Magnetic Resonance Elastography of the Brain," in: Proceedings of the 9$^{th}$ Annual Meeting of ISMRM, Glasgow, Scotland, 2001, p. 1647.

J. Braun, et al., "In Vivo Mangnetic Resonance Elastography of the Human Brain Using Ultrafast Acquisition Techniques," in: Proceedings of the 10$^{th}$ Annual Meeting of ISMRM, Honolulu, 2002, p. 2597.

M.A. Dresner, et al., "Magnetic Resonance Elastography of Skeletal Muscle," J. Magn. Reson. Imaging, vol. 13, 2001, p. 269-276.

I. Sack, et al., "Analysis of Wave Patterns in MR Elastography of Skeletal Muscle Using Coupled Harmonic Oscillator Simulations," Magn. Reson. Imagining, vol. 20, 2002, p. 95-104.

K. Uffman, et al., "In Vivo Determination of Biceps Elasticity with MR Elastography," in: Proceedings of the 10$^{th}$ Annual Meeting of ISMRM, Honolulu, 2002, p. 37.

A.J. Lawrence, et al., "Palpating Breast Cancer by Magnetic Resonance Elastography," in: Proceedings of the 7$^{th}$ Annual Meeting of ISMRM, Philadelphia, 1999, p. 525.

E.E.W Van Houten, et al., "Initial In Vivo Experience with Steady-State Subzone-Based MR Elastography of the Human Breast," J. Magn. Reson. Imaging, vol 17, 2003, p. 72-85.

G.C. Scott, et al., "Measurement of Nonuniform Current Density by Magnetic Resonance," IEEE Trans. On Med. Imaging, vol. 10, No. 3, Sep. 1991, p. 362-374.

E.J. Woo, et al., "Impedance Tomography Using Internal Current Density Distribution Measured by Nuclear Magnetic Resonance," Proc. SPIE, vol. 2299, 1994, p. 377-385.

* cited by examiner

METHOD FOR DETECTION AND IMAGING OF SYNCHRONOUS SPIN AND CHARGED PARTICLE MOTION

This application claims priority to British Patent Application 0427686.1, filed Dec. 17, 2004, the entire contents of which are incorporated herein by reference.

BACKGROUND OF THE INVENTION

The invention relates to the field of nuclear magnetic resonance (NMR), in particular to NMR imaging methods and systems. Even more particularly, the invention relates to the enhancement of magnetic resonance (MR) image contrast.

The publications and other materials, including patents, used herein to illustrate the invention and, in particular, to provide additional details respecting the practice are incorporated herein by reference. For convenience, the publications are referenced in the following text by author and date and are listed in the appended bibliography.

A physician generally checks for the presence of tumors and other tissue abnormalities by palpating a patient and feeling differences in the compliance or "stiffness" of soft tissues, such as muscles, brain, liver and adipose tissue, thereby detecting potential irregularities. Palpation is in fact the most common means for detecting tumors of the prostate gland and the breast. However, unfortunately, deeper lying structures are not accessible for evaluation via palpation.

Magnetic resonance elastography (MRE) offers a non-invasive diagnostic method that extends the physician's ability to assess the mechanical properties of soft tissues throughout a patient's body (R. Muthupillai et al., Science 1995, and R. Muthupillai et al., Magn Reson Med, 1996). Many pathologies of these tissues cause a change in their mechanical properties and a number of studies have demonstrated the potential use of quantitative measurements of tissue elasticity to identify the affected region, such as in the prostate (M. A. Dresner et al., Proc. ISMRM, 1999 and R. Sinkus et al., Proc. ISMRM, 2003), head (J. P. Felmlee et al., Proc. ISMRM, 1997; S. A. Kruse et al., Proc. ISMRM, 1999; J. Rydberg et al., Proc. ISMRM, 2001; and J. Braun et al., Proc. ISMRM, 2002), skeletal muscle (M. A. Dresner et al., J Magn Reson Imaging, 2001; I. Sack et al., Magn Reson Imaging, 2002; and K. Uffmann et al., Proc. ISMRM, 2002), and breast (A. J. Lawrence et al., Proc. ISMRM, 2002; R. Sinkus et al., Phys Med Biol, 2000; and E. E. van Houten et al., J Magn Reson Imaging, 2000).

U.S. Pat. No. 5,757,185 to Hennig describes a method based on a principle similar to MRE, namely, on the motion of charged particles or time-dependent magnetic fields generated by moving particles which are measured with phase sensitive imaging methods to assess the properties of soft tissue throughout a patient's body. Two radio-frequency (RF) pulses are applied to a sample located in a homogeneous external magnetic field and a spatially variable magnetic gradient field (GF) is applied in the time interval between the first RF pulse exciting the NMR signal and the read-out of the corresponding signal. The magnetic gradient field (GF) is chosen so as to cause a velocity-dependent change in the phase and/or amplitude of the signals from spins moved in the direction of the magnetic field gradient by application of external electric fields to the sample. The techniques are known as Magnetic resonance current density imaging (MRCD, G. C. Scott et al., 1989) or Magnetic resonance electrical impedance tomography (MREIT, E. J. Woo et al. 1994). The information gathered by these methods about electrical conductivity of a biological tissue is useful for many purposes, such as for locating the source of electrocardiogram (ECG) and encephalogram (EEG) signals, modelling tissues to investigate action potential propagations, estimating therapeutic current distribution during electrical stimulation, and monitoring physiological functions.

During MRE measurements, a stress which varies periodically in magnitude is used to impart mechanical motion to spins to produce shear waves which have wavelengths that are determined by/correlate to the mechanical properties of the sample.

Similarly, during MRCDI/MREIT measurements, a time-dependent electric field which varies periodically in magnitude is used to induce motion to charged particles. This induces time-dependent magnetic fields or motion-related spin dephasing in the sample being tested that relate to the sample's electrical conductivity.

As disclosed in U.S. reissue Pat. No. RE 32,701 to Moran, NMR can be used to detect and image the movement of spins. NMR signals can be sensitized to detect moving spins by applying a bipolar magnetic field gradient (GF) at the appropriate time in each NMR measurement sequence. The phase of the resulting NMR signal measures the velocity of spins along the direction of the motion sensitizing field gradient. Generally, the method is based on the differing development of the signal phase of stationary and moving particles in a bipolar magnetic field gradient along the direction of motion (see L. E. Crooks, N. M. Hylton in Vascular Diagnostics, eds. P. Lanzer and J. Rosch, Springer Verlag, Heidelberg, 1994, p. 366). The signal phase of stationary nuclei return to their initial value after application of a bipolar magnetic field gradient, whereas the signal phase of moving nuclei undergoes a dephasing proportional to the velocity of motion as well as to the strength of the magnetic field gradient, thus resulting in a spatial phase dispersion. Small cyclic displacements, e.g., on the micron to submicron level, can be detected by synchronizing a motion sensitizing gradient (MSG), which constitutes a combination of bipolar gradients, with an oscillating mechanical excitation of the tissue of interest (see U.S. Pat. Nos. 5,592,085 and 5,825,186). Images of low frequency transverse acoustic strain waves in tissue are generated using gradient-echo or spin-echo MR phase contrast techniques (R. Muthupillai et al., Magn Reson Med, 1996, and R. Sinkus, Phys Med Biol, 2000). These techniques are applied in combination with MSG for several cycles in synchronization with the applied stress to allow for significant phase accumulation. The cyclic MSG waveforms can be applied along any desired axis with variable frequency and number of gradient cycles and normally two acquisitions are made in an interleaved fashion to reduce systematic errors. Consequently, standard MRE experiments, as, e.g., disclosed in U.S. Pat. Nos. 5,592,085 and 5,825,186, suffer from long acquisition times due to the time needed for magnetization preparation for motion sensitizing, followed by a single readout of NMR signals. Furthermore, there is some technical demand for synchronization of MSG gradients with the mechanical excitation. Similar considerations apply to the generation of MRCDI/MREIT images.

Contrast enhancement in nuclear magnetic resonance (NMR) imaging can extend its diagnostic potential.

Thus, there is a need for a system and method that provides an improved contrast mechanism for NMR images which reveals the mechanical and/or electrical properties of a sample.

There is also a need for a system and method that provides a very fast modality for generating NMR images revealing mechanical and electrical properties of the sample/object, such as stiffness or electrical impedance with high sensitivity.

There is furthermore a need for a system and method that adds contrast and enhances the sensitivity by subtraction and/or summation of steady-state images.

There is also a need to reduce the technical demand posed by synchronization of MSG and mechanical motion of spins or charged particles.

SUMMARY OF THE INVENTION

The present invention is, in one embodiment, directed at a method for producing an image of a sample with an NMR system comprising the steps of: imparting mechanical motion to spins or charged particles within the sample to produce shear waves or time-dependent magnetic fields therein; conducting a scan of the sample with the NMR system using a steady-state pulse sequence that is designed to be sensitive to alternating spin phase dispersion due to shear wave motion or time-dependent magnetic fields within the sample; and reconstructing an image from the acquired steady-state NMR data which indicates the net steady-state NMR signals produced at each pixel location and wherein the net steady-state NMR signals are perturbed by the spatial phase dispersion of the NMR signals caused by shear waves or by time-dependent magnetic fields.

In another embodiment, the invention is directed at a method of nuclear magnetic resonance (NMR) for the detection of motion of spins or charged particles located in a sample comprising:
(a) placing the sample in a homogeneous external magnetic field;
(b) subjecting the sample to a fast train of radio-frequency pulses to induce in said sample within at least one spin ensemble a steady-state situation, ergo, a steady-state magnetization;
(c) applying stress to the sample which varies periodically in magnitude to produce in the sample shear waves having wavelengths, wherein said wavelengths are determined by the mechanical properties of the sample; and/or applying a time-dependent electric field to the sample which varies periodically in magnitude to induce time-dependent magnetic fields in the sample, wherein said magnetic fields are determined by the electrical properties of the sample;
(d) conducting a scan of the sample with an NMR imaging system to acquire NMR signals,
(e) reconstructing an image from said NMR signals via magnetic field gradients of a pulse sequence and wherein each of said NMR signals is a steady-state signal at a pixel location of the image.

An ensemble of spins possesses as an ensemble a certain magnetization. Thus, a steady-state situation of a spin ensemble is, in the context of the present invention, equivalent to a steady-state magnetization.

The present invention is, in yet another embodiment, directed at a method of nuclear magnetic resonance (NMR) imaging for the detection of oscillatory motions of spins and/or charged particles in a sample comprising:
(a) placing the sample in a homogeneous external magnetic field;
(b) subjecting the sample to a fast train of radio-frequency pulses to induce in said sample a steady-state magnetization;
(c) imparting mechanical motion to spins and/or charged particles within the sample to produce shear waves or time-dependent magnetic fields in said sample so that spin phase dispersions alternate, wherein said alternating spin phase dispersions disturb the steady-state magnetization;
(d) acquiring steady-state NMR signals via a scan of the sample with a NMR imaging system, wherein the NMR signal's amplitude and/or phase are modulated depending on the spin phase dispersion;
(e) reconstructing a modulated image from said steady-state NMR signals.

BRIEF DESCRIPTION OF THE DRAWINGS

FIG. 4 shows a three dimensional, thus volumetric, variant of the time dependence of the method in accordance with the invention as illustrated in FIG. 2a.

FIG. 5 shows a three dimensional, thus volumetric, variant of the time dependence of the method in accordance with the invention as illustrated in FIG. 3a.

DETAILED DESCRIPTION OF THE INVENTION AND VARIOUS AND PREFERRED EMBODIMENTS

Figure 1:
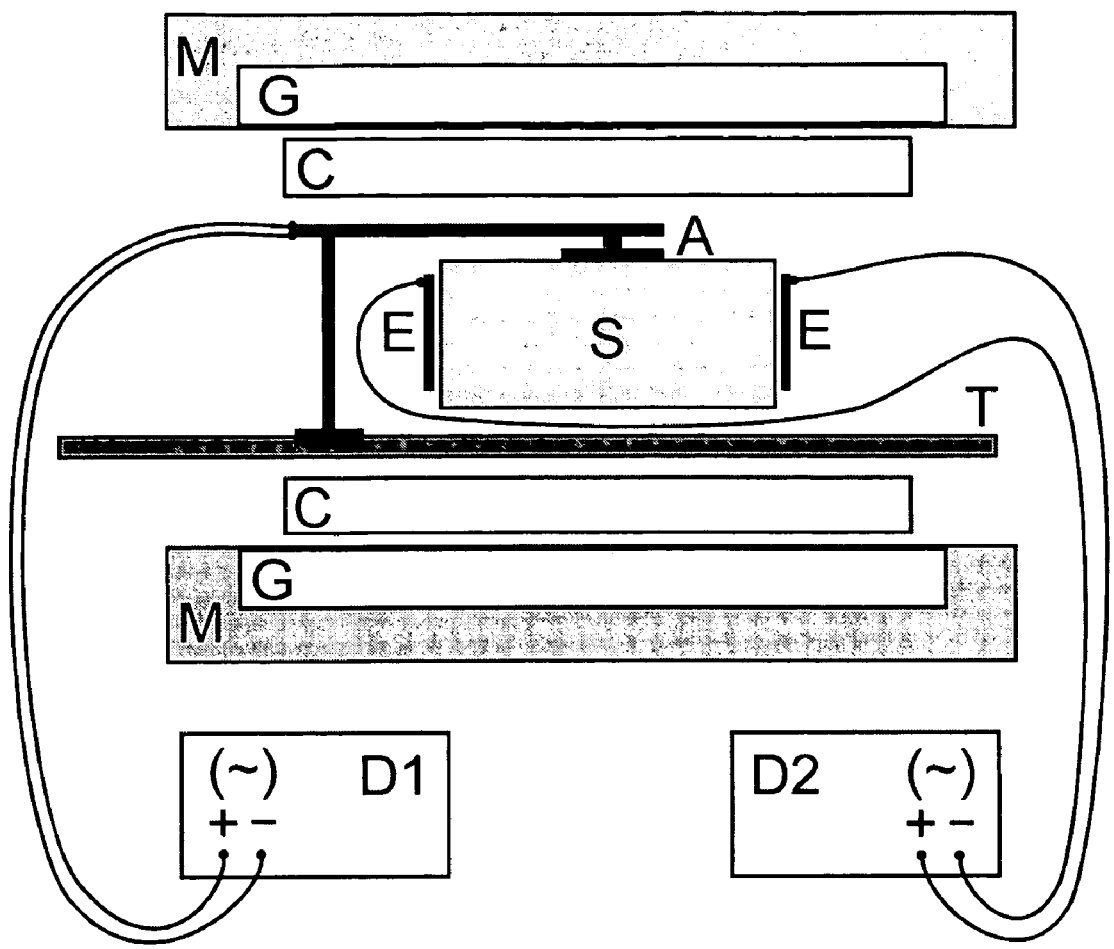
FIG. 1 shows a schematic of a measurement configuration for carrying out the methods in accordance with the invention.

The present invention provides a NMR method, in particular a NMR imaging method, with which the mechanical and/or electrical properties of soft tissues can be assessed. In certain preferred embodiments this assessment is accomplished with high sensitivity, and/or without long acquisition times and/or the need for synchronization. A sample located in a homogeneous external magnetic field may be subjected to fast train(s) of radio-frequency (RF) pulses, variable in duration and strength, to produce a steady-state NMR signal. Magnetic gradient fields (GF), variable in duration and space, may be applied during each time interval between the RF pulses which excite the NMR signal and the read-out of the signal. A stress to impart mechanical motion of spins or an electric field inducing charged particle motion may be applied during the excitation sequence.

During a fast radio-frequency pulse train, the spin ensemble/magnetization is unable to return to its thermal equilibrium state, and under certain conditions, reaches a dynamic equilibrium state (H. Y. Carr, Phys Review 1958; Y. Zur et. al., Magn Reson Med, 1988; and A. Oppelt et al., Electromedia, 1896). In this dynamic equilibrium state, i.e., steady-state, transverse spins/magnetization precess during each time repetition-interval (TR-interval) with an intrinsic angle $\Theta_{int}$, due to various sources of off-resonances, such as field inhomogenities or non-balanced magnetic field gradients, and with an extrinsic angle $\Theta_{ext}$, representing precession induced by external sources such as electrical currents or by spin motion. Steady-state free precession (SSFP) sequences induce a non-zero steady-state magnetization. In standard SSFP experiments a single dynamic equilibrium state is produced. In contrast, oscillating steady-states can be generated by periodically alternating radio-frequency-phases (rf-phases) or by periodically varying the amount of precession within a TR interval (S. S. Vasanawala et al., Magn Reson Med, 1999; S. S. Vasanawala et al., Magn Reson Med, 2000; S. Patz et al., Magn Reson Imaging, 1988; and W. R. Overall et al., Magn Reson Med, 2002).

The present invention makes use of a precession angle $\Theta_{ext}$ with alternating polarity between consecutive TR intervals, generating a dual pair, SS1 and SS2, of alternating steady-states. Depending on the type of SSFP sequence used, the two distinct steady-states, SS1 and SS2, may not only depend on the amplitude of the perturbating external precession $\Theta_{ext}$, but also on the amount of internal off-resonance related precession $\Theta_{int}$.

MRE. In an elastic media, propagation of an acoustic strain wave with frequency ω and wave number k results in a cyclic displacement $$\Delta r_\omega(t) \propto \sin(\omega t + kr) = \sin(\omega t + \phi),$$

where $$\phi = kr \qquad [1]$$

The phase φ of an isochromat (a small region in a sample in which the static field is uniform) depends on the wave number k and on the position r and reflects the spatial properties of the transverse wave. Any MSG, or more generally, any gradient waveform G(t) for which the integral in equation [2] within each TR interval is not zero, induces a precession angle $\Theta_{ext}$ in the transverse magnetization, which reflects the spatial properties of the wave $$\Theta_{ext}(r) \propto A \cdot \sin(\phi + \phi_0) = \gamma \int \langle \Delta r_\omega(t) | G(t) \rangle dt \qquad [2]$$

and which is directly proportional to the amplitude (A) mechanical excursion. Alternating the polarity of either the motion sensitizing gradient or of the mechanical vibration of the isochromat within each TR interval, will result in an alternating precession angle $$\vartheta_{ext}(n,r) \propto (-1)^n A \cdot \sin(\varphi) = \gamma \int_{(n-1) \cdot TR}^{n \cdot TR} \langle \Delta r_\omega(t) | G(t) \rangle \qquad [3]$$

where $$\Delta r_\omega(t + n \cdot TR) = -\Delta r_\omega(t + (n \pm 1) \cdot TR),$$

or $$G(t + n \cdot TR) = -G(t + (n \pm 1(\cdot TR) \qquad [4]$$

As a result, two distinct oscillating steady-states SS1 and SS2 are induced in the dynamic equilibrium state.

Figure 7:
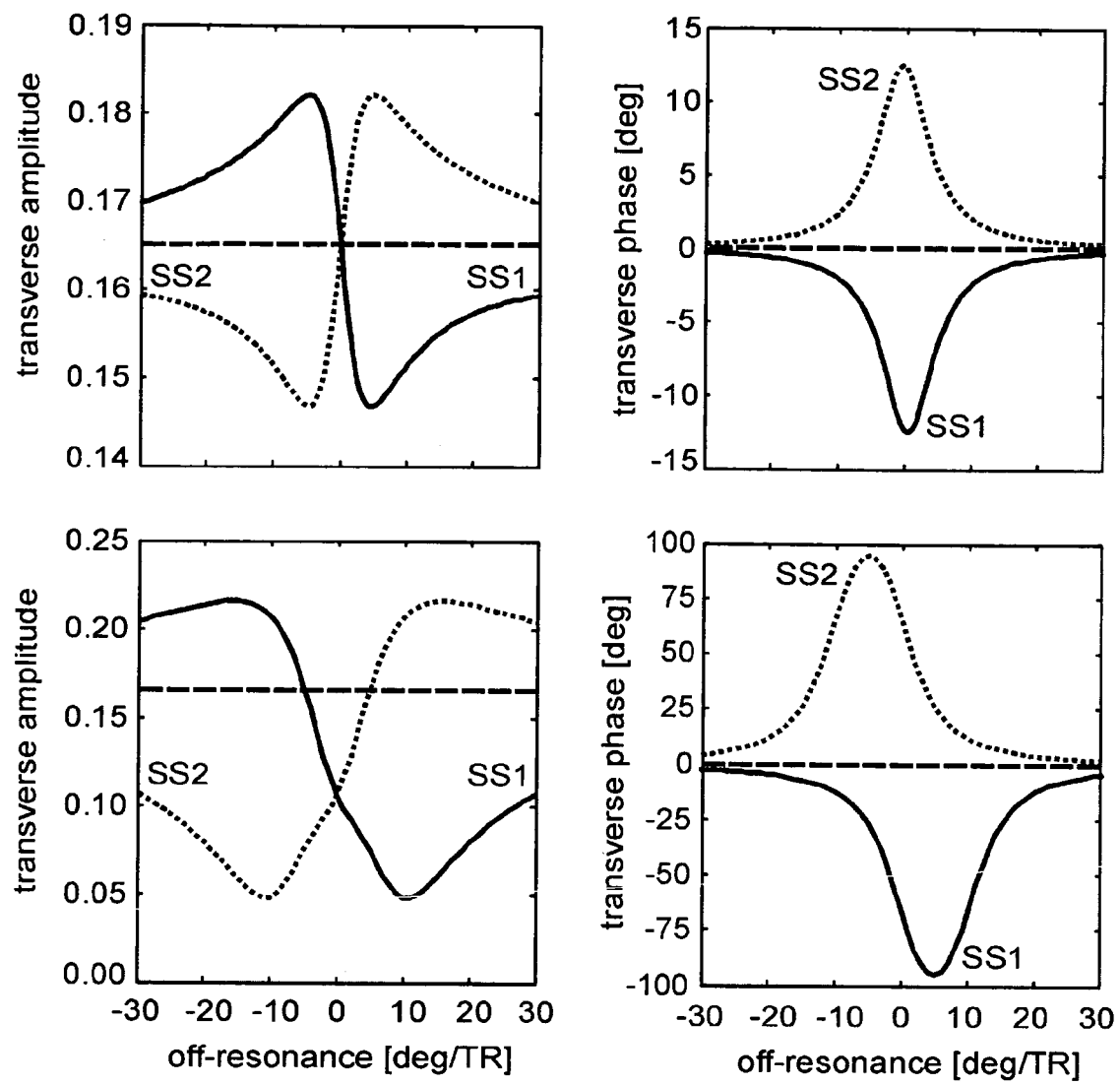
FIG. 7 shows the steady-state modulation of a balanced SSFP sequence as a function of the off-resonance frequency for different magnitudes (1[deg]: upper row, 10[deg]: lower row) of alternating, external precession angles $\Theta_{ext}$. This dependence is used to map mechanical or electrical oscillations into signal amplitude and signal phase changes.

As shown in FIG. 7, steady-state SS1 at negative off-resonance frequencies corresponds to steady-state SS2 at positive off-resonances, and vice versa, as can be expected from the oscillating polarity of the perturbing precession angle $\Theta_{ext}$ in combination with the unperturbed symmetry of steady-states created by alternating RF pulses. Modulation of steady-states compared to the unperturbed state occurs both in amplitude and in phase, and is large even for very low amplitudes of alternating precession angles. Amplitude perturbations in steady-states SS1 and SS2 are spread over a broad range of precession angles $\Theta_{int}$, whereas phase discrepancies are maximal for zero to low precession angles. Consequently, the perturbation of the balanced steady-state by a precession angle $\Theta_{ext}$ with alternating polarity is easily detected at low off-resonance frequencies via the phase, and at high off-resonance frequencies via the amplitude modulation of the resulting oscillating states SS1 and SS2.

Figure 6:
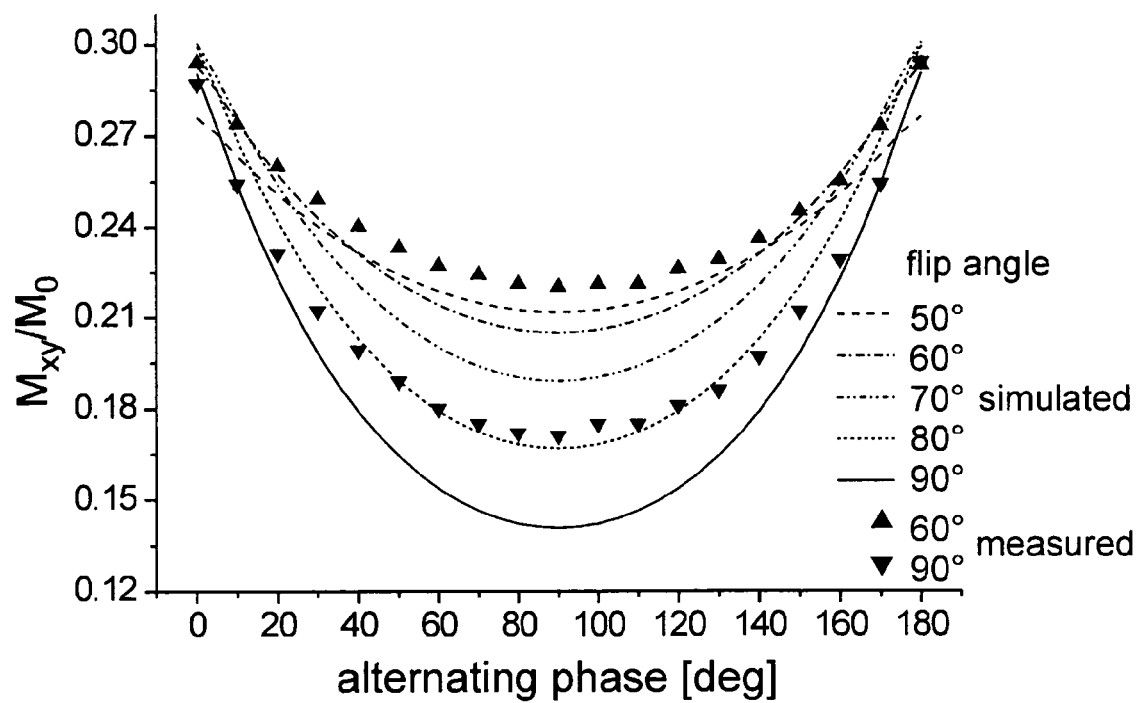
FIG. 6 shows the signal magnitude of a non-balanced steady-state free precession (SSFP) sequence as a function of the alternating, external precession angle $\Theta_{ext}$. This dependence is used to map mechanical or electrical oscillations into signal amplitude and signal phase changes. $M_{xy}/M_0$ is the transversal magnetization/the equilibrium magnetization.

Dependence of SS1 and SS2 on alternating $\Theta_{ext}$ for non-balanced steady-state free precession is shown in FIG. 6. As shown, the signal of a non-balanced SSFP sequence decreases with increasing alternating, external precession angle $\Theta_{ext}$ until ±90° and recovers to its undisturbed signal intensity at ±180°. This dependence of the non-balanced SSFP signal on alternating precession angles transforms mechanical or electrical oscillations into signal amplitude and signal phase changes.

MREIT, MRCDI. A current I is injected into a electrically conducting sample through a pair of surface electrodes, inducing an electric current density J and from Ampere's law a magnetic field B is formed inside the conducting sample, $$J(r) = \frac{1}{\mu_0} \nabla \times B(r) \qquad [5]$$

The magnetic field B generates a phase angle $\Theta_{ext}$ that is used to generate oscillating steady-states SS1 and SS2. Alternating phase angles $\Theta_{ext}$ can be produced by applying an alternating electrical potential at the surface electrodes of the sample. Similarly, oscillatory motion of spins (attached to charged particles) can be produced with said alternating electrical potential, resulting in an alternating phase angle $\Theta_{ext}$ as given by equation [3, 4].

In one embodiment, the present invention provides for a contrast mechanism for NMR images which reveals the mechanical and/or electrical properties of the sample. The method uses, in certain embodiments, the sensitivity of the dynamic equilibrium of steady-state pulse sequences to spin phase dispersions having alternating polarity with respect consecutive repetition time intervals. The principle of steady-state pulse sequences used for conventional MR imaging is described in H. Y. Carr, Phys Review 1958 and Y. Zur et. al. 1988. Frequency-tuned repetition times in combination with intrinsically available gradients used for imaging, e.g. read gradients, as sensitizing cyclic MSG waveforms, induce spin phase dispersion of alternating polarity in samples exposed to periodic stress or periodic electrical fields. As a consequence, perturbations of the dynamic equilibrium are induced that produce an oscillating steady-state depending on the magnitude of alternating spin phase dispersion.

The invention also provides, in certain embodiments, a very fast modality for generating NMR images revealing mechanical or electrical properties of the sample, such as stiffness or electrical impedance, with high sensitivity. Often, because the spin phase dispersions are very small, in prior art methods such as the one described in U.S. Pat. No. 5,825,186, the magnetic sensitizing gradient (MSG) field is oscillated in synchronism with the applied stress or electrical field for several cycles before the NMR signal is acquired. This allows the accumulated spin phase to reach a significant amount. The method and system of the present invention makes, in certain embodiments, use of the intrinsic amplification of small alternating spin phase dispersions through the dynamic equilibrium state reached during a very fast train of radio-frequency pulses, thus allowing for 10 to 20 fold amplifications under standard conditions. Furthermore, inherently available magnetic field gradients of steady-state sequences may serve as MSG. Thus, in certain embodiments of the present invention, the need for spin phase accumulation and additional MSG is avoided and thus scan-time efficiency is improved by at least one order in magnitude compared to standard MRE sequences. The measurement time for 2D images is in the range of about 1 to 30 seconds, preferably about 1 to 10 seconds, even more preferably about 2 to 3 seconds.

The invention also provides, in selected embodiments, additional contrasts and enhances sensitivity by subtraction and/or summation of pairs of steady-state images. Furthermore, and in contrast to other methods, spin phase related perturbations (modulations) of the dynamic equilibrium state may generate not only phase related brightness-modulated images of the reconstructed steady-state but also amplitude related brightness-modulated images. Thus, in certain embodiments, contrast is mapped on the phase and/or amplitude of steady-states that affect both components of magnetization (transverse and longitudinal).

In some embodiments, the invention also avoids the technical demand posed by synchronization of MSG and mechanical motion of spins or charged particles of other methods.

Having described the invention in general terms, specific examples of various and preferred embodiments of the invention will be provided in the following description. In this description, reference is made to the accompanying drawings which form a part hereof, and in which there is shown by way of illustration selected preferred embodiments of the invention, which are not intended to limit the invention in any manner. As the person skilled in the art will appreciate, these embodiments do not necessarily represent the full scope of the invention. Reference is made to the claims herein for interpreting the scope of the invention.

A preferred NMR system in accordance with the invention has principle components schematically represented in FIG. 1. The system comprises a magnet M, which produces a homogeneous external magnetic field constant in time, a gradient coil system G for the production of magnetic field gradients GF which are variable in time, a high frequency coil or system of high frequency coils C for the production and detection of an NMR signal. The system further comprising a measurement sample S, which is not described in further detail, located on a moving table T at the measurement center of the apparatus. Finally, the system comprises a NMR-compatible piezoelectric actuator A for MR elastography, which can, in certain embodiments, be amplitude and frequency modulated, and which is connected to a power supply D1 and/or, surface electrodes E for MRCDI/MREIT, which may be voltage regulated for the production of AC (alternating current), connected to a power supply D2.

Figure 2A:
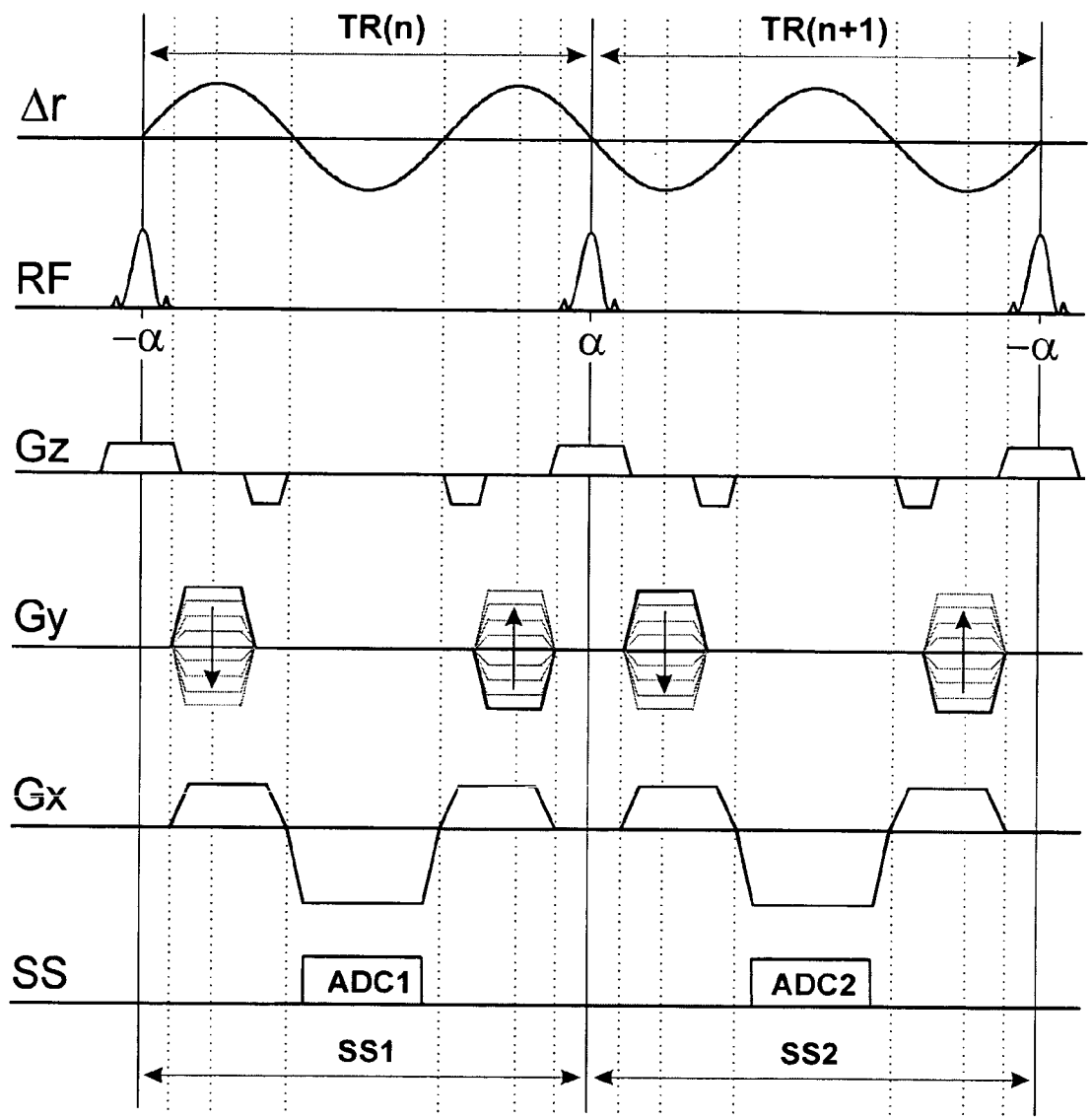
FIG. 2a shows the time dependence of an embodiment of the method of the invention in which an applied mechanical stress or electrical field induces an oscillatory motion $\Delta r$ or oscillatory phase of spins having a repetition time of exactly three half of the period of the oscillatory excitation. The Figure also shows radio-frequency (RF) excitation pulses along the time axis "RF", magnetic field gradients "Gx, Gy, Gz" which are switched-on and -off, as well as signal readout periods for steady-state SS1 and SS2, respectively. Magnetic field gradients Gx, Gy, Gz are completely balanced within each repetition period.
Figure 2B:
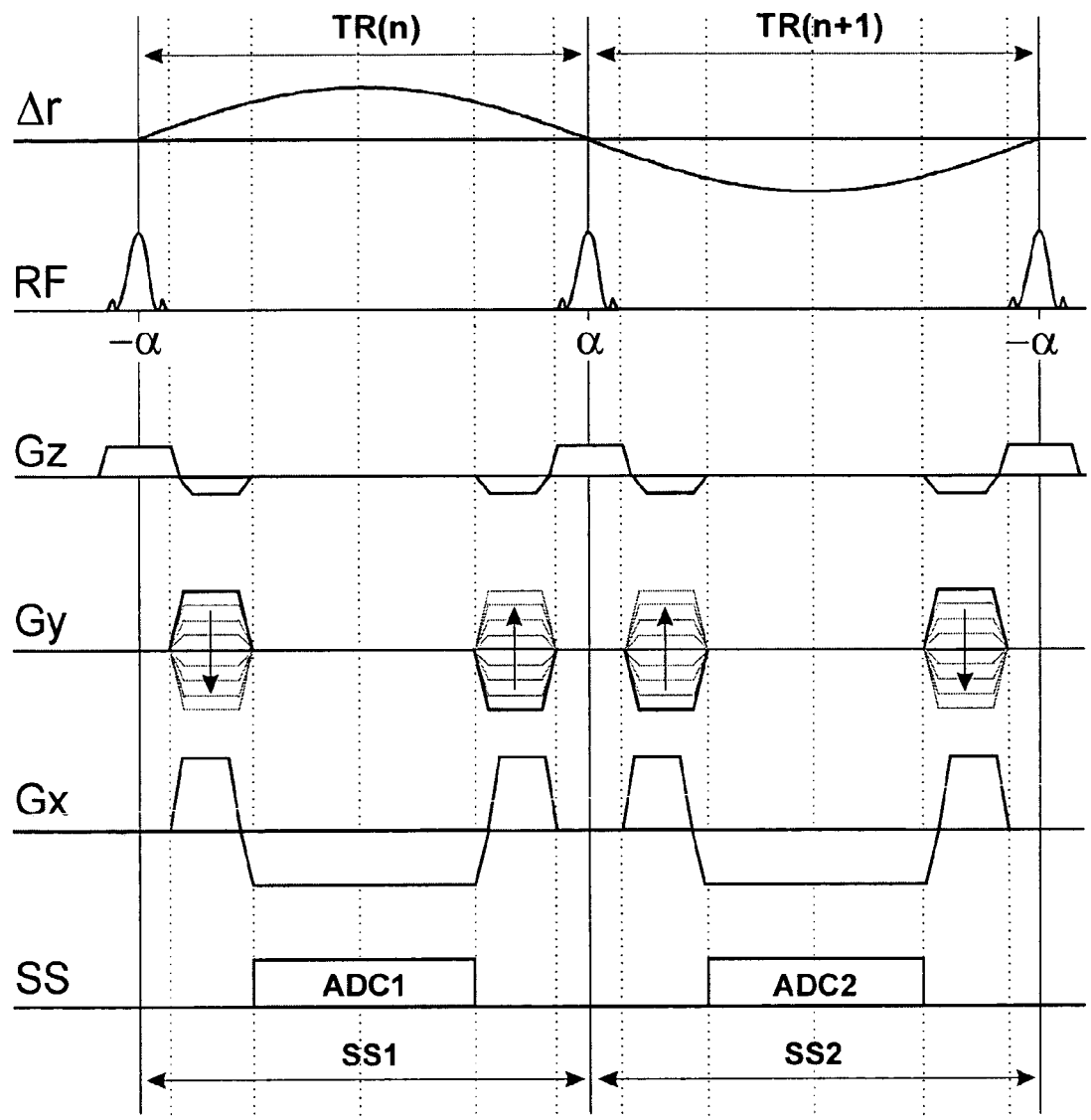
FIG. 2b depicts an embodiment similar to that shown in FIG. 2a, but here the oscillatory motion $\Delta r$ or oscillatory phase of the spins has a repetition time of exactly half of the period of the oscillatory excitation.
Figure 2C:
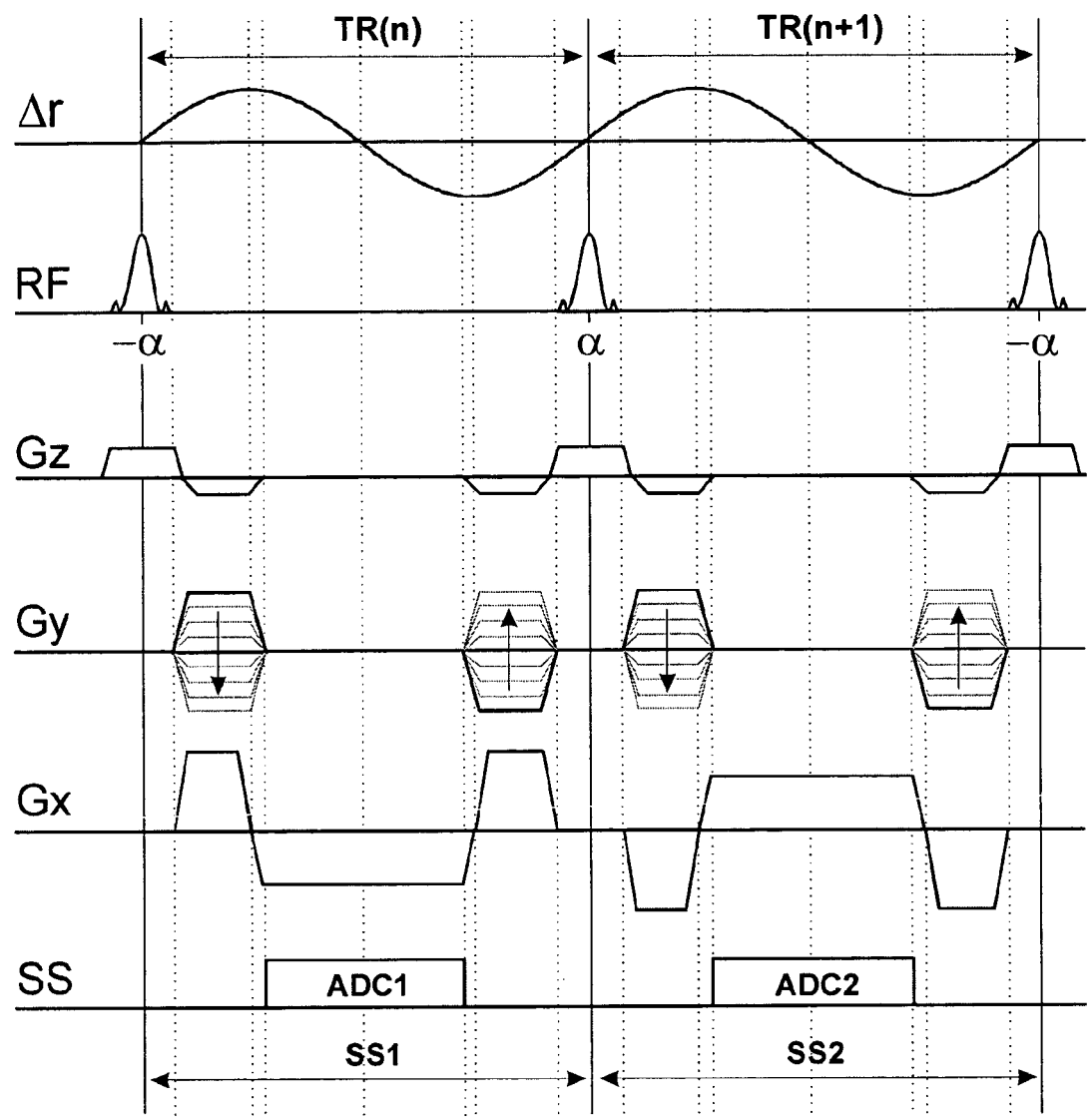
FIG. 2c depicts an embodiment similar to that shown in FIG. 2a, but here the oscillatory motion $\Delta r$ or oscillatory phase of the spins has a repetition time of exactly the period of the oscillatory excitation.

In MRE, a MR-compatible piezoelectric actuator A may be used to impart mechanical motion to spins within the sample S to produce shear waves therein. Alternatively, spin motion may be imparted by applying alternating currents E to the sample, or by a direct induction of alternating phases through an alternating magnetic field produced by alternating currents passing the sample (MRDCI/MREIT). However, as the person skilled in the art will appreciate, other methods of imparting motion into spins are within the scope of the present invention. A typical experiment forming the basis of the method in accordance with the invention is depicted in FIGS. 2a through 2c. In each of these Figures, a mechanical stress or electrical field is applied and induces an oscillatory motion $\Delta r$ of the spins having a certain repetition time (TR) of the oscillatory excitation. An excitation pulse train is illustrated on the time axis RF. FIG. 2a. shows three radio-frequency pulses within two succeeding repetition time intervals TR(n) and TR(n+1), respectively. The TRs according to the present invention may be in the range of about 2 to about 40 ms, preferably in the range of about 2 to about 30 ms, more preferably in the range of about 2 to about 20 ms, even more preferably in the range of about 2 to about 10 ms. Shorter TRs hereby result in reduced scan times. Magnetic field gradients for slice selection (Gz), phase encoding (Gy) and readout (Gx) are fully balanced over each TR interval (repetition period), i.e., induce no dephasing of magnetization within the time interval (i.e., gradient-time integrals are nulled within each repetition time) and alternating radio-frequency pulses (rf-pulses) for excitation are applied (i.e., linear phase increments of $\phi_n = n\pi$) to avoid the refocused signal having a phase opposed to the primary echo. The shear wave related oscillatory motion of an isochromat is, for sake of clarity, synchronized with the rf-repetition time and illustrated on the time axis $\Delta r$. In an experiment carried out in accordance with the embodiment shown in FIG. 2a., the repetition time, TR, between succeeding radio-frequency pulses equals three half of the period of the mechanical excitation (TR=$\frac{3}{2}$T=$\frac{3}{2} \cdot 2\pi \cdot \omega^{-1}$), thereby alternating the polarity of the oscillatory motion of the isochromat, $\Delta r$, as required by equation [3,4]. The read gradient is designed to accumulate, due to the alternating polarity of the mechanical motion of the isochromat, an alternating phase within each TR interval (see equation [6]), wherein encoding, and thus an analog-digital converter (ADC) readout, equals half of the period of the mechanical excitation to achieve maximal sensitivity. Phase encoding and slice selection gradients have been chosen so as to be insensitive to the oscillatory motion. Consequently, rewinding or rephasing gradients (having opposite amplitude compared to the encoding or selection gradients) are exactly one period spaced apart. In summary, the method in accordance with the invention as shown in FIG. 2a generates an alternating spin phase dispersion $\Theta_{ext}$ due to oscillatory motion and the switching of imaging in the completely balanced SSFP scheme as follows:

$$\vartheta_{ext}(n,r) \begin{cases} \propto (-1)^n A \cdot \sin(\varphi + \varphi_0), & G_x = G_{read} \\ \approx 0, & G_z = G_{slice} \\ = 0, & G_y = G_{phase} \end{cases} \quad [6]$$

This periodic change in the polarity of the precession angle generates oscillating steady-states, as illustrated on the time axis SS, referring to the attainment of NMR steady-state signals from states SS1 and SS2, respectively. FIG. 2a shows encoding of steady-state SS1, followed by identical encoding of steady-state SS2, yielding essentially the same view ordering for both states. As a result, the method in accordance with this embodiment of the invention reconstructs amplitude or phase, or amplitude and phase images from both oscillating steady-states, yielding a maximal number of four images.

FIG. 2b shows a similar experiment in which, however, the repetition time, TR, between consecutive radio-frequency pulses equals half of the period of the mechanical exciation $$\left(TR = \frac{1}{2}T = \frac{1}{2} \cdot 2\pi \cdot \omega^{-1}\right),$$

thus inducing an alternating polarity of the oscillatory motion of the isochromat as required by equation [3,4]. The read gradient accumulates, due to the alternating polarity of the mechanical motion of the isochromat, an alternating phase within each TR interval, which is maximal for maximal ADC readout period and consequently, at minimal bandwidth, yields maximal signal to noise. Slice selection rewinding and dephasing gradients, in accordance with the present invention, are played out immediately before or after slice selection gradients to accumulate a negligible, but alternating, amount of spin phase dispersion in the through slice direction. In contrast, a not negligible amount of precession due to the oscillatory motion of any isochromat is accumulated by phase encoding gradients, however, view ordering is reversed for steady-state SS2 compared to steady-state SS1, and thus alternation of spin phase dispersions are suppressed. In summary, the method in accordance with the present invention as illustrated in FIG. 2b is sensitive to oscillatory motions of spins in one direction, namely the read direction, even though spin phase accumulation in phase direction can not be nulled.

Phase dispersions with alternating polarity within odd and even TR intervals can further be achieved by alternating the polarity of the magnetic field gradients within each repetition time interval. FIG. 2c shows an embodiment of the present invention in which the repetition time, TR, between succeeding radio-frequency pulses equals one period of the mechanical excitation (TR=T=2 π·ω⁻¹). The alternating phase dispersion results from alternation of the read gradient's polarity, as required by equation [3,4]. Maximal sensitivity is again achieved for readout periods of equal length compared to half of the period of the mechanical motion. Slice selection and phase gradients cannot be placed to accumulate zero spin phase dispersions, however, phase accumulation is non-alternating, due to the equal period of the mechanical motion and the rf repetition time.

The methods in accordance with the embodiments of the invention represented in FIG. 2a through FIG. 2c are only sensitive to periodic displacements of an isochromat in one direction, namely the read direction. As with all steady-state free precession based methods, free precession can cause image artifacts unless the repetition time is kept small. It can thereby be particularly advantageous to choose the optimal experimental setup with the shortest repetition time (compare FIG. 2a through FIG. 2c) for a given frequency of mechanical excitation.

Figure 3A:
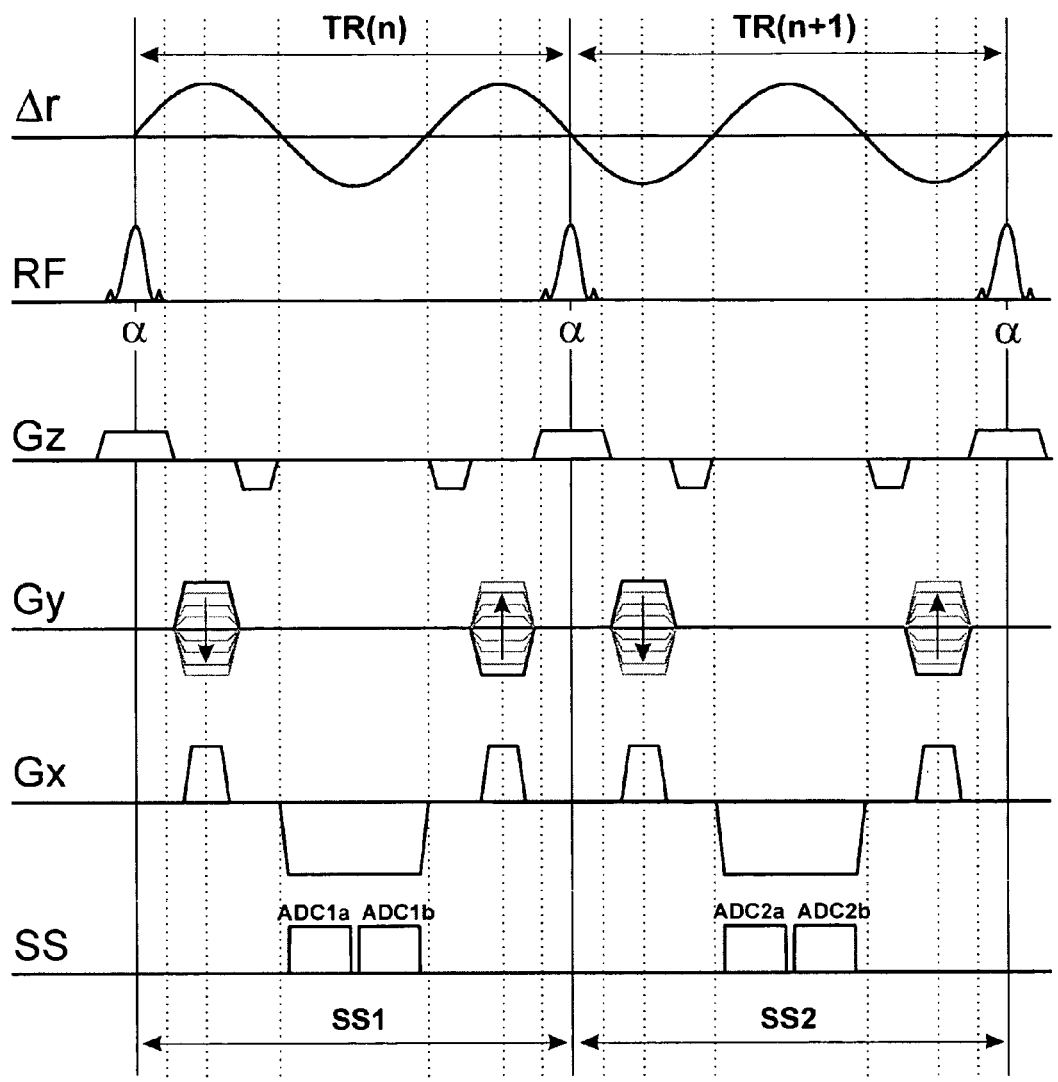
FIG. 3a depicts an embodiment similar to that shown in FIG. 2a, but here the magnetic field gradient Gx is not balanced within each repetition period and thus produces two echoes within each repetition.

Steady-state free precession sequence variations in accordance with the invention are represented in FIGS. 3a through 3c, and FIG. 5. The excitation pulse train is illustrated on the time axis RF, showing three radio-frequency pulses within two succeeding repetition time intervals TR(n) and TR(n+1), respectively. Magnetic field gradients for slice selection (Gz), phase encoding (Gy) are fully balanced over each TR interval (e.g. gradient-time integrals are nulled within each repetition time). The readout gradient (Gx) is not balanced (e.g., the gradient-time integral is set to $T_A \cdot G_x$ within each repetition time, where $T_A$ is the ADC readout period and $G_x$ the readout gradient strength during the ADC period), which results in two echoes at ADC1a and ADC1b within TR(n), and another two echoes ADC2a and ADC2b within TR(n+1). The oscillatory motion of an isochromat is, for sake of clarity, synchronized with the rf-repetition time and illustrated on the time axis Δr. In an experiment carried out in accordance with FIG. 3a, the repetition time, TR, between succeeding radio-frequency pulses equals three half of the period of the mechanical excitation (TR=³⁄₂T=³⁄₂·2π·ω⁻¹), thus alternating the polarity of the oscillatory motion of the isochromat, Δr, as required by equation [3,4]. The read gradient is designed to accumulate, due to the alternating polarity of the mechanical motion of the isochromat, an alternating phase of amplitude A within each TR interval (see equation [6]). Phase encoding and slice selection gradients have been chosen insensitive to the oscillatory motion as described in FIG. 2a. The periodic change in the polarity of the precession angle generates oscillating steady-states SS1 and SS2, respectively. In accordance with one embodiment of the present invention, FIG. 3a shows an encoding of steady-state SS1 (represented by two echoes ADC1a and ADC1b), followed by identical encoding of steady-state SS2 (represented by two echoes ADC2a and ADC2b), yielding essentially the same view ordering for both states. As a result, the method in accordance with this embodiment of the present invention reconstructs amplitude or phase or amplitude and phase images from both oscillating steady-states, yielding a maximal number of eight images.

Figure 3B:
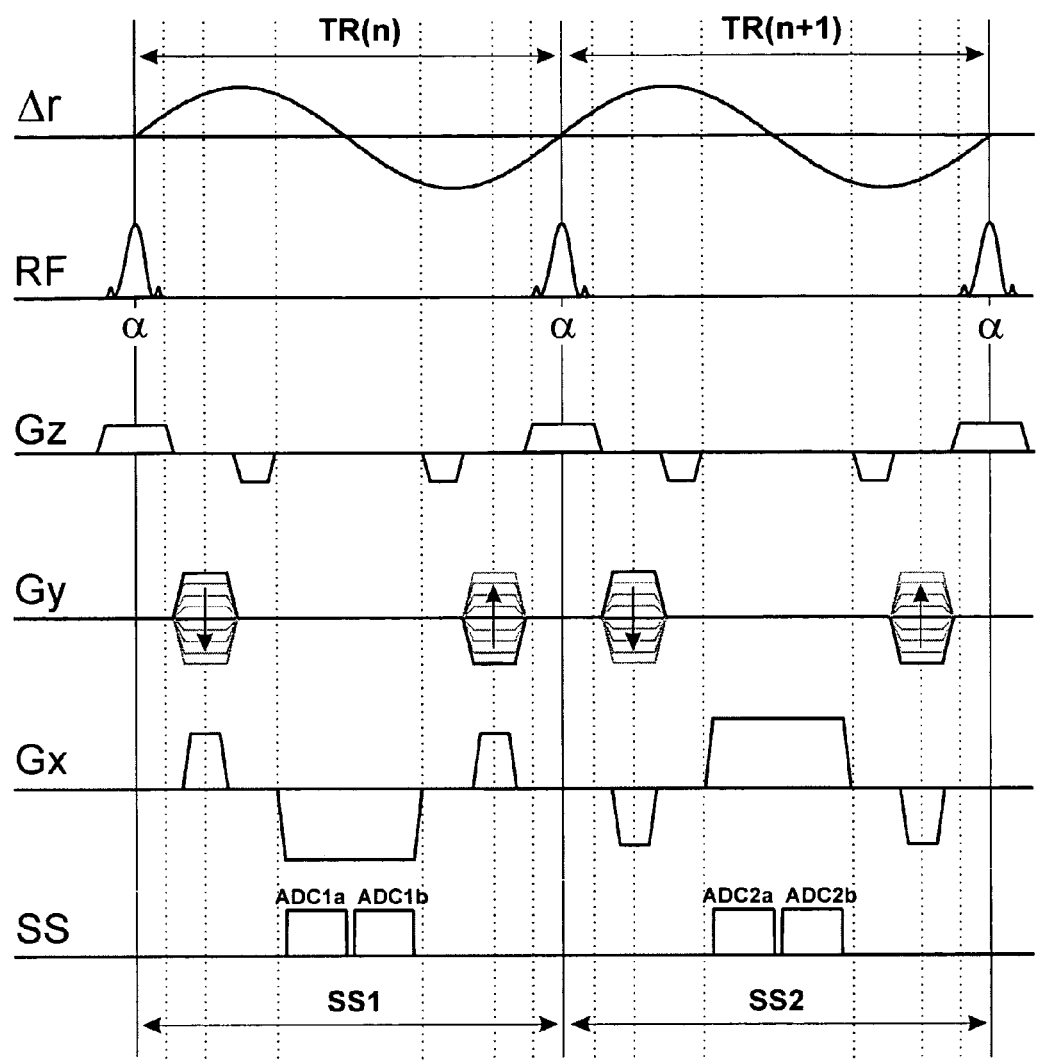
FIG. 3b depicts an embodiment similar to that shown in FIG. 3a, but here the oscillatory motion $\Delta r$ or oscillatory phase of the spins has a repetition time of exactly half of the period of the oscillatory excitation.

In FIG. 3b, a similar experiment is carried out, in which, however, the repetition time, TR, between succeeding radio-frequency pulses equals half of the period of the mechanical exciation $$\left(TR = \frac{1}{2}T = \frac{1}{2} \cdot 2\pi \cdot \omega^{-1}\right),$$

thus inducing an alternating polarity of the oscillatory motion of the isochromat as required by equation [3,4]. The method shown in FIG. 3b is identical to the method of FIG. 2b except for the readout gradient Gx. The readout gradient Gx is identical to FIG. 3a for the period TR(n), but has an opposite polarity for TR(n+1).

Figure 3C:
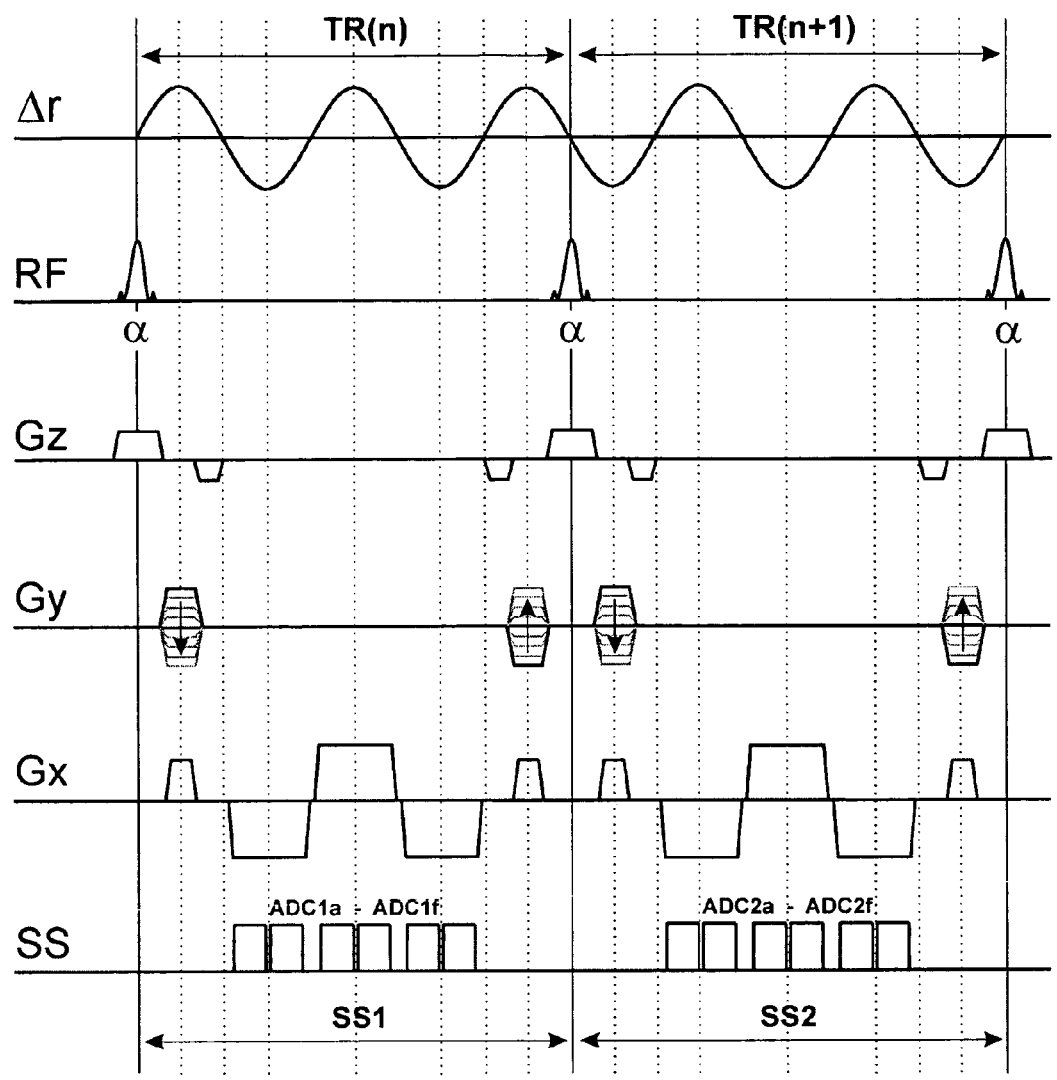
FIG. 3c depicts an embodiment similar to that shown in FIG. 3a, but here the oscillatory motion $\Delta r$ or oscillatory phase of the spins has a repetition time of exactly five half of the period of the oscillatory excitation and uses a non-balanced magnetic field gradient Gx that produces six echoes generated by gradient reversal.

FIG. 3c represents a further modification of FIG. 3a, in which, however, the repetition time, TR, between succeeding radio-frequency pulses equals five half of the period of the mechanical exciation $$\left(TR = \frac{5}{2}T = \frac{5}{2}2\pi \cdot \omega^{-1}\right),$$

thus inducing an alternating polarity of the oscillatory motion of the isochromat as required by equation [3,4]. The readout gradient Gx produces six echoes by gradient reversal. As in FIG. 3a, the readout gradient (Gx) is not balanced (e.g. the gradient-time integral is set to $T_A \cdot G_x$ within each repetition time, where $T_A$ is the ADC readout period and $G_x$ the readout gradient strength during the ADC period), which produces six echoes at ADC1a to ADC1f within TR(n), and another six echoes ADC2a to ADC2f within TR(n+1).

The methods in accordance with the embodiments of the invention represented in FIG. 3a through FIG. 3c are only sensitive to periodic displacements of an isochromat in one direction, namely the read direction.

Figure 4:
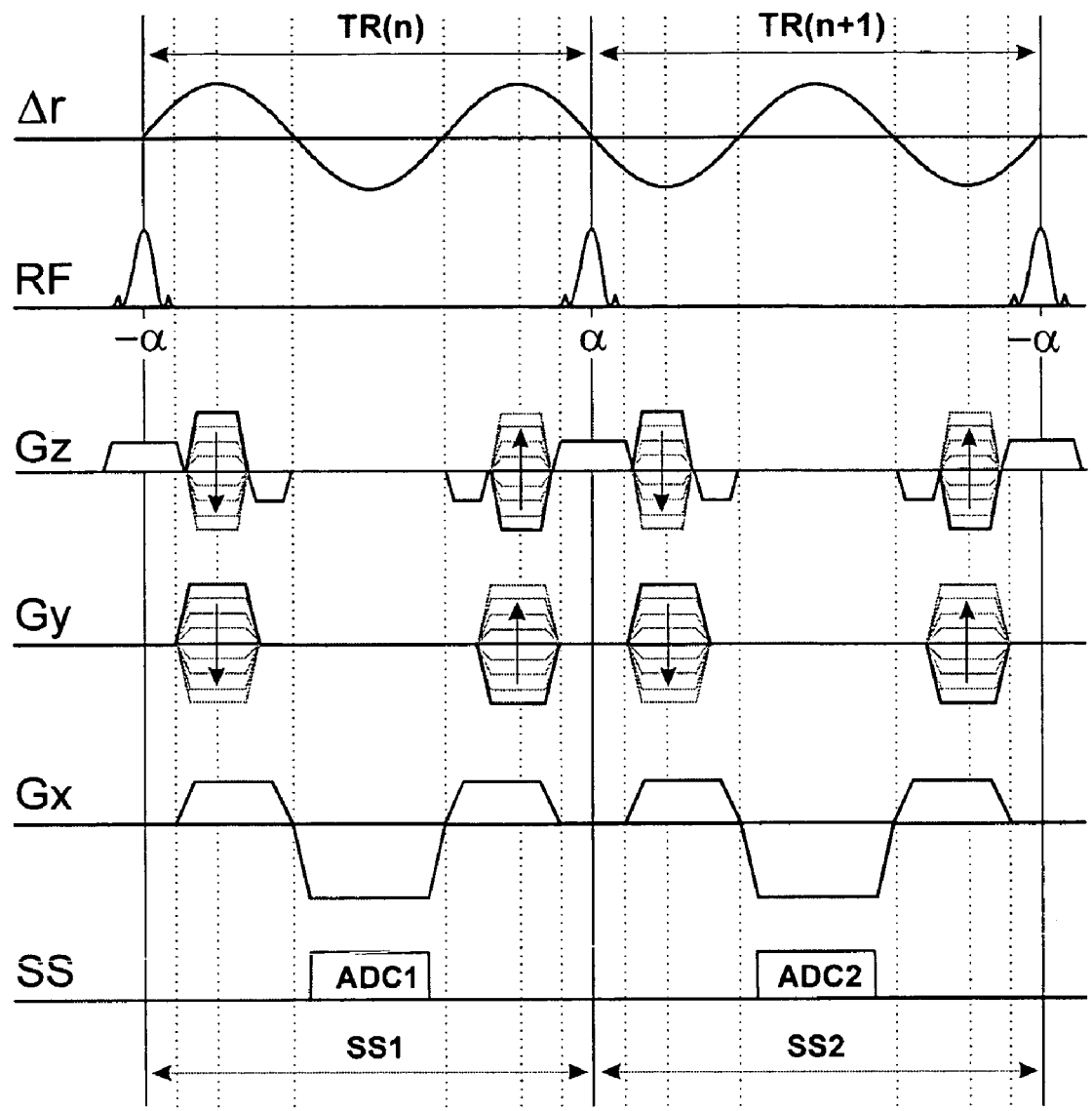
Figure 5:
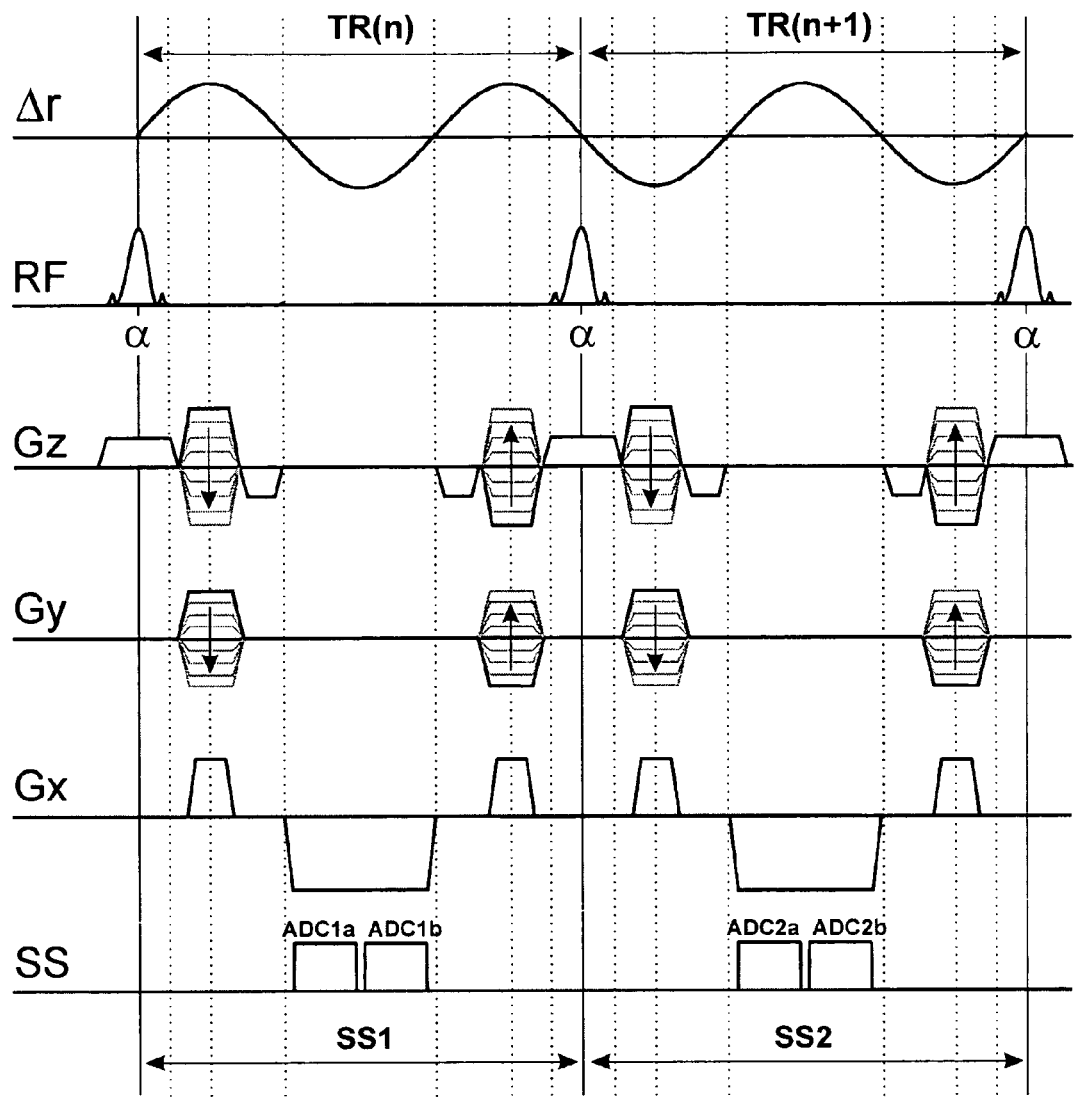

All methods presented hitherto generate two dimensional images. A modification of these methods for the generation of 3D volumetric images is well within the skill of the person skilled in the art and can, e.g., be accomplished by adding on phase encoding gradients in the slice encoding direction as illustrated exemplary in FIG. 4 for the method presented in FIG. 2a, and FIG. 5 for the method presented in FIG. 3a.

Generally, the phase and amplitude information present in both imaged steady-states, SS1 and SS2, can be added or subtracted to yield additional contrasts. For the balanced SSFP versions shown in FIG. 2a-c and FIG. 4 the antisymmetric nature of steady-state perturbation shows up as a point-symmetry and as a mirror-symmetry in phase and amplitude images of both states, respectively. The alternating precession angle between successive TR intervals results further in a spatial correlation of the MRE maps from both states. An isochromat seen by state SS1 with a positive precession angle due to the mechanical vibration corresponds to an isochromat as seen at the same position by state SS2 with a negative precession angle (see FIG. 7). Thus, a spatial positive precession angle in state SS1 corresponds to a negative precession angle in state SS2, which results in an opposite mapping of the spatial properties of the transverse wave with respect to state SS1 and SS2. Consequently, summation of balanced SSFP MRE images from both states almost cancel, whereas subtraction results in an enhancement in the sensitivity of the mapped acoustical effects.

As the person skilled in the art will appreciate, measurements can also be carried out with the mechanical excitation being synchronized with the radio-frequency pulse train having a defined phase offset. Repeating the experiment with different phase offset ranging from 0 up to 2π, thus representing different time points in the propagation of the transverse acoustic strain wave (see equation [1]), yields a dynamic representation of the shear wave.

BIBLIOGRAPHY

U.S. Patent Documents:

| U.S. Pat. No. 5825186 | October 1998 | Ehman et al. | 324/309 |
| U.S. Pat. No. 5592085 | January 1997 | Ehman | 324/309 |
| U.S. Pat. No. 5757185 | May 1998 | Hennig | 324/300 |
| U.S. Re32701 | June 1988 | Moran | 324/309 |

OTHER PUBLICATIONS

1) H. Y. Carr. Steady-state free precession in nuclear magnetic resonance. Phys Rev 1958, 112(5), 1693.
2) Oppelt A., R. Graumann, H. Barfuss, H. Fischer, W. Hartl, W. Schajor. FISP: eine neue schnelle Pulsseqenz fur die Kernspintomographie. Electromedica 1986, 54(1), 15.
3) Y Zur, S. Stokar, P. Bendel. An analysis of fast imaging sequences with steady-state transverse magnetization refocusing. Magn Reson Med 1988, 6, 175.
4) Vasanawala S S, Pauly J M, Nishimura D G. Fluctuating equilibrium MRI. Magn Reson Med 1999;42(5):876-883.
5) Vasanawala S S, Pauly J M, Nishimura D G. Linear combination steady-state free precession MRI. Magn Reson Med 2000;43(1):82-90.
6) Patz S. Some factors that influence the steady-state in steady-state free precession. Magn Reson Imaging 1988; 6(4):405-413.
7) Muthupillai R, Lomas D J, Rossman P J, Greenleaf J F, Manduca A, Ehman R L. Magnetic resonance elastography by direct visualization of propagating acoustic strain waves. Science 1995;269(5232):1854-1857.
8) Muthupillai R, Rossman P J, Lomas D J, Greenleaf J F, Riederer S J, Ehman R L. Magnetic resonance imaging of transverse acoustic strain waves. Magn Reson Med 1996; 36(2):266-274.
9) Sinkus R, Lorenzen J, Schrader D, Lorenzen M, Dargatz M, Holz D. High-resolution tensor MR elastography for breast tumour detection. Phys Med Biol 2000;45(6):1649-1664.
10) Overall, W R, Conolly, S M, Nishimura, D G, Hu, B S. Oscillating dual-equilibrium steady-state angiography. Magn Reson Med 2002; 47:513-522.
11) Dresner M A, Rossman P J, Kruse S A, Ehman R L. MR elastography of the prostate. In: Proceedings of the 10th Annual Meeting of ISMRM, Philadelphia, 1999. p 526.
12) Sinkus R, Nisius T, Lorenzen J, Kemper J, Dargatz M. In-vivo prostate MR-elastography. In: Proceedings of the 11th Annual Meeting of ISMRM, Toronto, Canada. 2003. p 586.
13) Felmlee J P, Rossman P J, Muthupillai R, Manduca A, Dutt V, Ehman R L. Magnetic resonance elastography of the brain. In: Proceedings of the 5th Annual Meeting of ISMRM, Vancouver, Canada. 1997. p 683.
14) Kruse S A, Dresner M A, Rossman P J, Felmlee J P, Jack C R, Ehman R L. Palpation of the brain using magnetic resonance elastography. In: Proceedings of the 7th Annual Meeting of ISMRM, Philadelphia, 1999. p 258.
15) Rydberg J, Grimm R, Kruse S A, Felmlee J P, McCracken P, Ehman R L. Fast spin-echo magnetic resonance elastography of the brain. In: Proceedings of the 9th Annual Meeting of ISMRM, Glasgow, Scotland, 2001. p 1647.
16) Braun J, Bernarding J, Tolxdorff T, Sack I. In vivo magnetic resonance elastography of the human brain using ultrafast acquisition techniques. In: Proceedings of the 10th Annual Meeting of ISMRM, Honolulu, 2002. p 2597.

17) Dresner M A, Rose G H, Rossman P J, Muthupillai R, Manduca A, Ehman R L. Magnetic resonance elastography of skeletal muscle. J Magn Reson Imaging 2001; 13: 269-276.

18) Sack I, Bernarding J, Braun J. Analysis of wave patterns in MR elastography of skeletal muscle using coupled harmonic oscillator simulations. Magn Reson Imaging 2002; 20: 95-104.

19) Uffman K, Mateiesi S, Quick H H, Ladd M E. In vivo determination of biceps elasticity with MR elastography. In: Proceedings of the 10th Annual Meeting of ISMRM, Honolulu, 2002. p 37.

20) Lawrence A J, Rossman P J, Mahowald J L, Manduca A, Hartmannn L C, Ehman R L. Assessment of breast cancer by magnetic resonance elastography. In: Proceedings of the 7th Annual Meeting of ISMRM, Philadelphia, 1999. p 525.

21) Van Houten E E, Doyley M M, Kennedy F E, Weaver J B, Paulsen K D. Initial in vivo experience with steady-state subzone-based MR elastography of the human breast. J Magn Reson Imaging 2003; 17: 72-85.

22) Scott G C, Joy M L G, Armstrong R L, Henkelman R M. Measurement of nonuniform current density by magnetic resonance. IEEE Trans Med Imaging 1989;10:362

23) Woo E J, Lee S Y, Mun C W. Impedance tomography using internal current density distribution measured by nuclear magnetic resonance. Proc SPIE, San Diego, 1994. p. 377

What is claimed is:

1. A method of nuclear magnetic resonance (NMR) for the detection of motion of spins in a sample comprising:
(a) placing the sample in a homogeneous external magnetic field;
(b) subjecting the sample to a fast train of radio-frequency pulses to induce in said sample a steady-state magnetization;
(c) applying stress to the sample which varies periodically in magnitude to produce in the sample shear waves having wavelengths, wherein said wavelengths are determined by the mechanical properties of the sample;
(d) conducting a scan of the sample with an NMR imaging system to acquire NMR signals,
(e) reconstructing an image from said NMR signals via magnetic field gradients of a pulse sequence and wherein each of said NMR signals is a steady-state signal at a pixel location of the image.

2. The method of claim 1 wherein the steady-state magnetization is disturbed by an alternating phase dispersion of said spins for each repetition of said radio-frequency pulses of said radio-frequency pulse train.

3. The method of claim 2 wherein a repetition rate of said repetitions of said radio-frequency pulses and said magnetic field gradients is an integer multiple of half of the frequency of said periodically varying mechanical excitation.

4. The method of claim 3 wherein the repetition rate of said radio-frequency pulses and said magnetic field gradients have a defined phase relative to said periodically varying mechanical excitation.

5. The method of claim 3 wherein an oscillatory movement of spins and application of said magnetic field gradients for each repetition generate said alternating phase dispersion.

6. The method of claim 5 wherein said mechanical excitation has a direction parallel to a direction of said magnetic field gradients.

7. The method of claim 5 wherein a time integral of all said magnetic field gradients applied between consecutive of said radio-frequency pulses is zero.

8. The method of claim 5 wherein a time integral of said magnetic field gradients applied between consecutive of said radio-frequency pulses is non-zero and constant along one or more axes of said magnetic field gradients.

9. The method of claim 5 wherein said alternating phase dispersion is suppressed along one or two directions of said magnetic field gradients.

10. The method of claim 3 wherein an oscillatory movement of spins and application of only one magnetic field gradient direction of said magnetic field gradients generate said alternating phase dispersion.

11. The method of claim 1 further comprising applying additional magnetic field gradients in different directions for generation of additional spin phase dispersions.

12. The method of claim 1, further comprising applying in (c) a time-dependent electric field to the sample which varies periodically in magnitude to induce time-dependent magnetic fields in the sample, wherein said magnetic fields are determined by the electrical properties of the sample.

13. A method of nuclear magnetic resonance (NMR) imaging for the detection of oscillatory motions of spins in a sample comprising:
(a) placing the sample in a homogeneous external magnetic field;
(b) subjecting the sample to a fast train of radio-frequency pulses to induce in said sample a steady-state magnetization;
(c) imparting mechanical motion to spins within the sample to produce shear waves in said sample so that spin phase dispersions alternate, wherein said alternating spin phase dispersions disturb the steady-state magnetization;
(d) acquiring steady-state NMR signals via a scan of the sample with a NMR imaging system, wherein the NMR signals' amplitude and/or phase are modulated depending on the spin phase dispersion; and
(e) reconstructing a modulated image from said steady-state NMR signals.

14. The method of claim 13 wherein a repetition rate of said radio-frequency pulses and said magnetic field gradients is an integer multiple of half of the frequency of periodically varying mechanical excitations that are applied to said sample to produce said shear waves or time-dependent magnetic fields.

15. The method of claim 14 wherein the oscillatory motion of said spins and application of magnetic field gradients for each repetition of said radio-frequency pulses generate said alternating phase dispersion.

16. The method of claim 15 wherein a time integral of all said magnetic field gradients applied between consecutive of said radio-frequency pulses is zero.

17. The method of claim 15 wherein a time integral of said magnetic field gradients applied between consecutive of said radio-frequency pulses is non-zero and constant along one or more axis of said magnetic field gradients.

18. The method of claim 15 wherein said alternating phase dispersion is suppressed along one or two directions of said magnetic field gradients.

19. The method of claim 14 wherein said oscillatory motion of spins and application of only one magnetic field gradient direction of said magnetic field gradients generate said alternating phase dispersion.

20. The method of claim 14 wherein the repetition rate of said radio-frequency pulses and said magnetic field gradients have a defined phase relative to said periodically varying mechanical excitation.

21. The method of claim 13, further comprising imparting in (c) mechanical motion to charged particles within the sample to produce time-dependent magnetic fields.

22. A method of nuclear magnetic resonance (NMR) for the detection of time-dependent magnetic fields in a sample comprising:
   (a) placing the sample in a homogeneous external magnetic field;
   (b) subjecting the sample to a fast train of radio-frequency pulses to induce in said sample a steady-state magnetization;
   (c) applying a time-dependent electric field to the sample which varies periodically in magnitude to induce time-dependent magnetic fields in the sample, wherein said magnetic fields are determined by the electrical properties of the sample;
   (d) conducting a scan of the sample with an NMR imaging system to acquire NMR signals,
   (e) reconstructing an image from said NMR signals via magnetic field gradients of a pulse sequence and wherein each of said NMR signals is a steady-state signal at a pixel location of the image.

23. The method of claim 22 wherein the steady-state magnetization is disturbed by an alternating phase dispersion for each repetition of said radio-frequency pulses of said radio-frequency pulse train.

24. The method of claim 23 wherein a repetition rate of said repetitions of said radio-frequency pulses and said magnetic field gradients is an integer multiple of half of the frequency of said periodically varying electrical excitation.

25. The method of claim 24 wherein said periodically varying electrical excitation generates said alternating phase dispersion.

26. The method of claim 25 wherein said electrical excitation has a direction parallel to a direction of said magnetic field gradients.

27. The method of claim 25 wherein a time integral of all said magnetic field gradients applied between consecutive of said radio-frequency pulses is zero.

28. The method of claim 25 wherein a time integral of said magnetic field gradients applied between consecutive of said radio-frequency pulses is non-zero and constant along one or more axes of said magnetic field gradients.

29. The method of claim 25 wherein said alternating phase dispersion is suppressed along one or two directions of said magnetic field gradients.

30. The method of claim 24 wherein the repetition rate of said radio-frequency pulses and said magnetic field gradients have a defined phase relative to said periodically varying electrical excitation.

31. A method of nuclear magnetic resonance (NMR) imaging for the detection of charged particles in a sample comprising:
   (a) placing the sample in a homogeneous external magnetic field;
   (b) subjecting the sample to a fast train of radio-frequency pulses to induce in said sample a steady-state magnetization;
   (c) imparting mechanical motion to charged particles within the sample so that spin phase dispersions alternate, wherein said alternating spin phase dispersions disturb the steady-state magnetization;
   (d) acquiring steady-state NMR signals via a scan of the sample with a NMR imaging system, wherein the NMR signals' amplitude and/or phase is modulated depending on the spin phase dispersion; and
   (e) reconstructing a modulated image from said steady-state NMR signals.

32. The method of claim 31 wherein a repetition rate of said radio-frequency pulses and said magnetic field gradients is an integer multiple of half of the frequency of periodically varying electrical excitations that are applied to said sample to impart said motion to charged particles.

33. The method of claim 32 wherein the oscillatory motion of said particles and application of magnetic field gradients for each repetition of said radio-frequency pulses generate said alternating phase dispersion.

34. The method of claim 33 wherein a time integral of all said magnetic field gradients applied between consecutive of said radio-frequency pulses is zero.

35. The method of claim 33 wherein a time integral of said magnetic field gradients applied between consecutive of said radio-frequency pulses is non-zero and constant along one or more axis of said magnetic field gradients.

36. The method of claim 33 wherein said alternating phase dispersion is suppressed along one or two directions of said magnetic field gradients.

37. The method of claim 32 wherein said oscillatory motion of particles and application of only one magnetic field gradient direction of said magnetic field gradients generate said alternating phase dispersion.

38. The method of claim 32 wherein the repetition rate of said radio-frequency pulses and said magnetic field gradients have a defined phase relative to said periodically varying electrical excitation.

* * * * *